United States Patent [19]
Colby

[11] Patent Number: 6,114,780
[45] Date of Patent: Sep. 5, 2000

[54] ELECTROMAGNETIC ACTUATING MECHANISM

[75] Inventor: Paul C. Colby, Sunnyvale, Calif.

[73] Assignee: Electroglas, Inc., Santa Clara, Calif.

[21] Appl. No.: 09/200,286

[22] Filed: Nov. 23, 1998

[51] Int. Cl.[7] .................................................. H02K 41/00
[52] U.S. Cl. ................................................. 310/12; 310/42
[58] Field of Search .................................. 310/12, 13, 14, 310/42; 33/1 M; 74/471 XY; 108/137, 138; 29/721, 760, 785

[56] References Cited

U.S. PATENT DOCUMENTS

| | | | |
|---|---|---|---|
| 4,709,174 | 11/1987 | Nakagawa | 310/12 |
| 4,922,143 | 5/1990 | Gosdowski | 310/12 |
| 5,179,304 | 1/1993 | Kenjo et al. | 310/12 |

*Primary Examiner*—Nestor Ramirez
*Assistant Examiner*—Judson H. Jones
*Attorney, Agent, or Firm*—Blakely, Sokoloff, Taylor & Zafman

[57] ABSTRACT

An apparatus and method for positioning a first stage relative to a second stage. An apparatus of the present invention comprises a motor system to move the first and second stages relative to each other and a motion control system to control the path of the stage being moved. One stage has a continuous surface with a continuous magnetizable region. Nonmagnetizable regions are uniformly patterned within the magnetizable region. A method of the present invention involves the construction of a stage by etching a plurality of though holes in a sheet and affixing the sheet to the top surface of a foundation. The present invention improves the accuracy and speed of a positioning stage.

24 Claims, 7 Drawing Sheets

ELECTROMAGNETIC ACTUATING MECHANISM

BACKGROUND OF THE INVENTION

1. Field of the Invention

The present invention relates generally to electromagnetic actuators and, in one example of the invention, to positioning systems and methods, and more specifically to wafer positioning systems and methods which control the movement of a substrate such as a semiconductor wafer on which numerous integrated circuits are located.

2. Background Information

Wafer positioning systems are used in different areas of semiconductor fabrication, such as wafer probing and photolithography. Most wafer positioning systems are based on combinations of linear motions of one of more stages in orthogonal directions.

One such wafer positioning system, as shown in FIGS. 1A–1B and 2, uses linear motors, such as Sawyer motors. Examples of such wafer positioning systems are manufactured by Electroglas of Santa Clara, Calif. The linear motors on wafer holding stage 10 are outboard motors and inboard motors bonded to a material layer 18, which can be made of aluminum. Each outboard motor comprises a pair of electromagnetic assemblies 20 coupled to each other by a permanent magnet 21. The surfaces of electromagnetic assemblies 20 have an alternating pattern of positioning teeth 32 and grooves 34. Each inboard motor comprises a pair of electromagnetic assemblies 24 coupled to each other by a permanent magnet 25. The surfaces of electromagnetic assemblies 24 have an alternating pattern of positioning teeth 28 and grooves 30. Grooves 30 and 34 are typically filled with epoxy to provide level surfaces. Positioning teeth 28 and 32 are magnetizable regions, while grooves 30 and 34 are nonmagnetizable regions.

Wafer holding stage 10 typically rides on the surface of a base stage 12 with the help of air bearings (not shown). Intersecting grooves 16 are etched into the surface of base stage 12 to from a repeating pattern of positioning teeth 14. Grooves 16 are typically filled with epoxy to provide a level surface on base stage 12. Positioning teeth 28 and 32 on wafer holding stage 10 can match up with a line of positioning teeth 14 on base stage 12 as the flux of the permanent magnets of the inboard and outboard motors is diverted among the poles of the electromagnetic assemblies. As the flux is diverted and different lines of teeth match up, wafer holding stage 10 moves incrementally across the surface of base stage 12.

An important feature of a base stage such as base stage 12 is the uniformity of the pattern of teeth, because the uniformity has a direct effect on the accuracy of the incremental movements of the wafer holding stage. Because the teeth are formed by etching intersecting grooves in the surface of the base stage, the etching of the grooves takes on great importance. Groove dimensions such as depth and width are critical in determining teeth uniformity. Unfortunately, current groove etching processes do not adequately provide the level of consistency to create grooves and teeth that are necessary to meet the demands of increasing stage movement accuracy.

Another important feature of a base stage is the size of the teeth. With smaller teeth, flux is concentrated into smaller areas, which means saturation occurs more quickly. With larger teeth, the saturation threshold is higher, thereby allowing more flux to flow through the teeth, which means a greater amount of force is available to move the wafer holding stage. Increased force provides increased speed. Unfortunately, narrow grooves, and hence larger teeth, are difficult to create using current techniques.

SUMMARY OF THE INVENTION

An electromagnetic actuating mechanism is described herein. The present invention provides, in one exemplary embodiment, a wafer positioning system which includes a motor system having a first stage facing a second stage and a movement control system to control the movement of the first and second stages relative to each other. The first stage has a surface with magnetizable and nonmagnetizable regions, which, in one embodiment, are grooves filled with epoxy. The second stage has a continuous surface with a continuous magnetizable region and nonmagnetizable regions, which, in one embodiment, are isolated cavities filled with epoxy. In one embodiment, the magnetizable regions of the first stage are uniformly patterned on the surface of the first stage. In another embodiment, the nonmagnetizable regions of the second stage are uniformly patterned in the continuous surface of the second stage.

The present invention also provides a method for making a base stage in a wafer positioning apparatus in accordance with the teachings of the present invention. In one example of this method, through holes are etched in a material sheet, which is then affixed to the top surface of a foundation. In another example of this method, the material sheet is heat treated before the through holes are etched. In still another example of this method, the though holes are filled with epoxy after the material sheet is affixed to the top surface of the foundation.

It will be appreciated that the electromagnetic actuator of the present invention may be used with different positioning systems. Other examples of positioning systems in which the present invention may be used will be understood from the following description. Additional features and benefits of the present invention will become apparent from the detailed description, figures and claims set forth below.

BRIEF DESCRIPTION OF THE DRAWINGS

Various embodiments of the present invention will be described in detail with reference to the following drawings in which like reference numerals refer to like elements. The present invention is illustrated by way of example and not limitation in the accompanying figures.

DETAILED DESCRIPTION

In the following description, specific details are set forth in order to provide a thorough understanding of the present invention. However, it will be apparent to one of ordinary skill in the art that the invention may be practiced without these specific details. In other instances, well-known structures and processing operations have not been described in particular detail in order to avoid unnecessarily obscuring the present invention.

Current linear motor-based wafer positioning systems use base stages that are typically etched with intersecting grooves to create a pattern of teeth. However, such base stages are limited by the fact that the etched grooves are often of varying dimensions, thereby reducing the uniformity of the resulting pattern of teeth. Furthermore, the teeth, or magnetizable areas, of such base stages are not large enough to support greater flux because it is difficult to etch uniformly narrow grooves. By increasing the uniformity and size of the magnetizable areas on a base stage, greater wafer holding stage movement accuracy and speed can be realized.

Figure 1A:
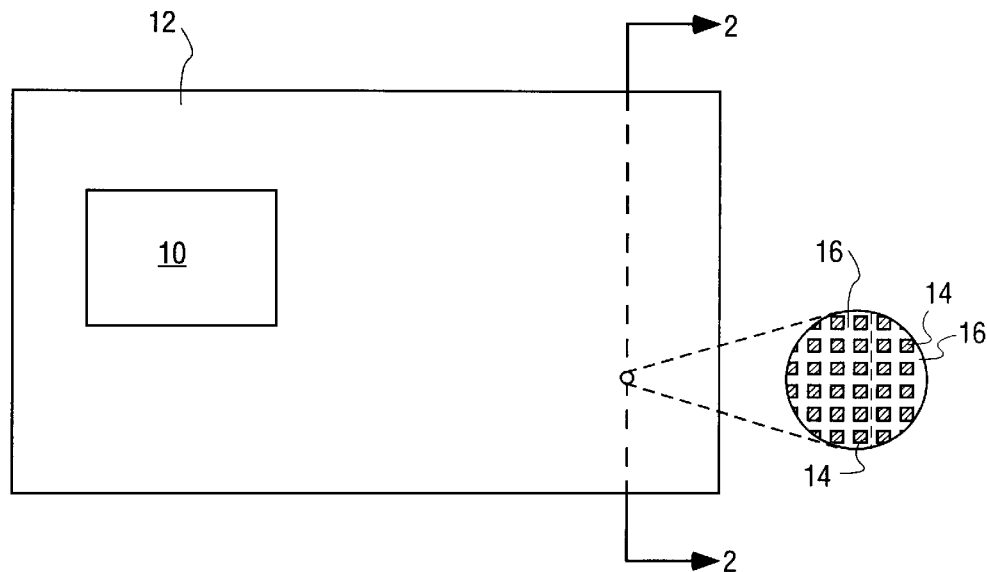
FIG. 1A is a top view of a prior art wafer positioning system.
Figure 1B:
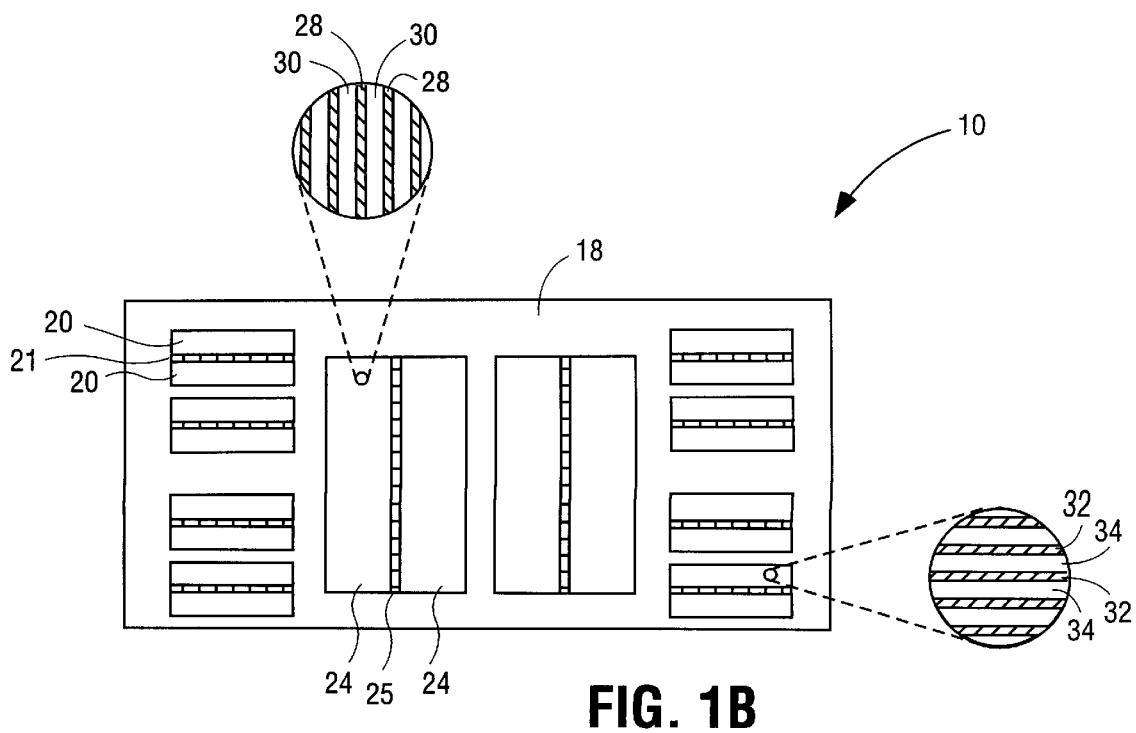
FIG. 1B is a bottom view of a wafer holding stage used in the prior art wafer positioning system shown in FIG. 1A.
Figure 2:
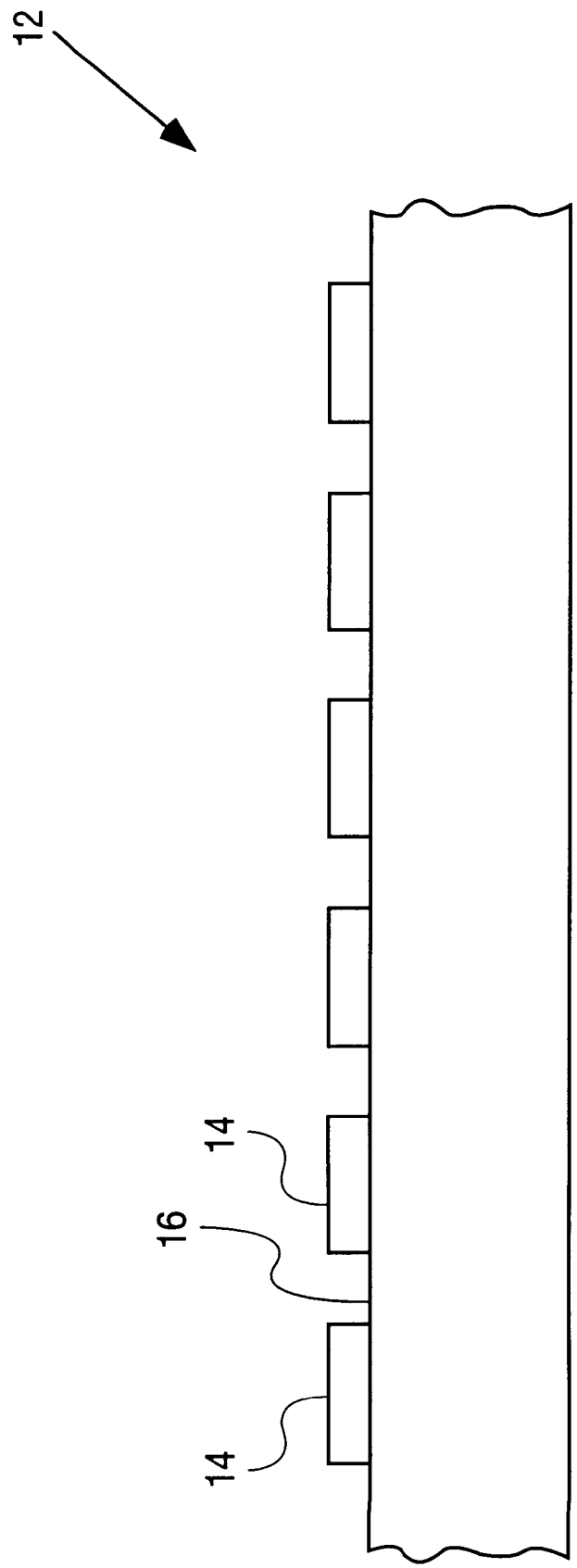
FIG. 2 is a cut-away view of the prior art wafer positioning system shown in FIG. 1A.
Figure 3A:
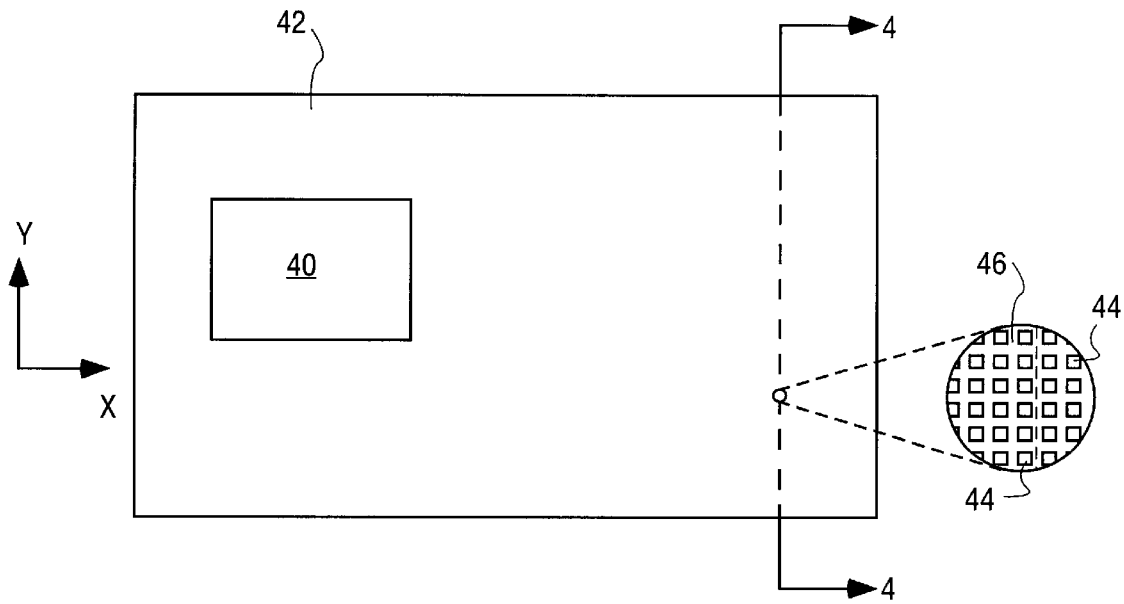
FIG. 3A is a top view of a wafer positioning system in accordance with the teachings of the present invention.
Figure 3B:
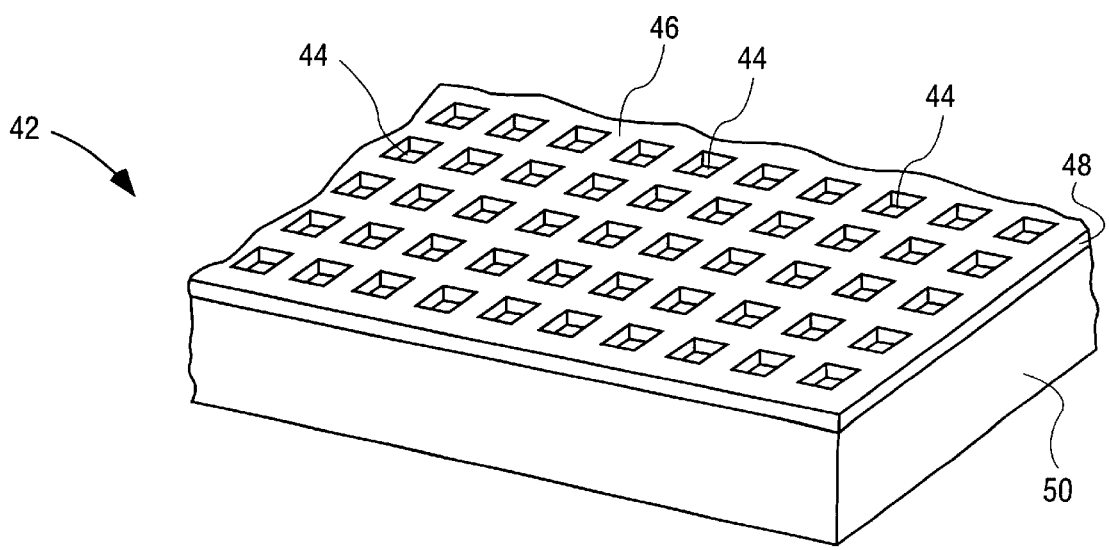
FIG. 3B is a perspective view of a base stage used in the wafer positioning system shown in FIG. 3A in accordance with the teachings of the present invention.
Figure 4:
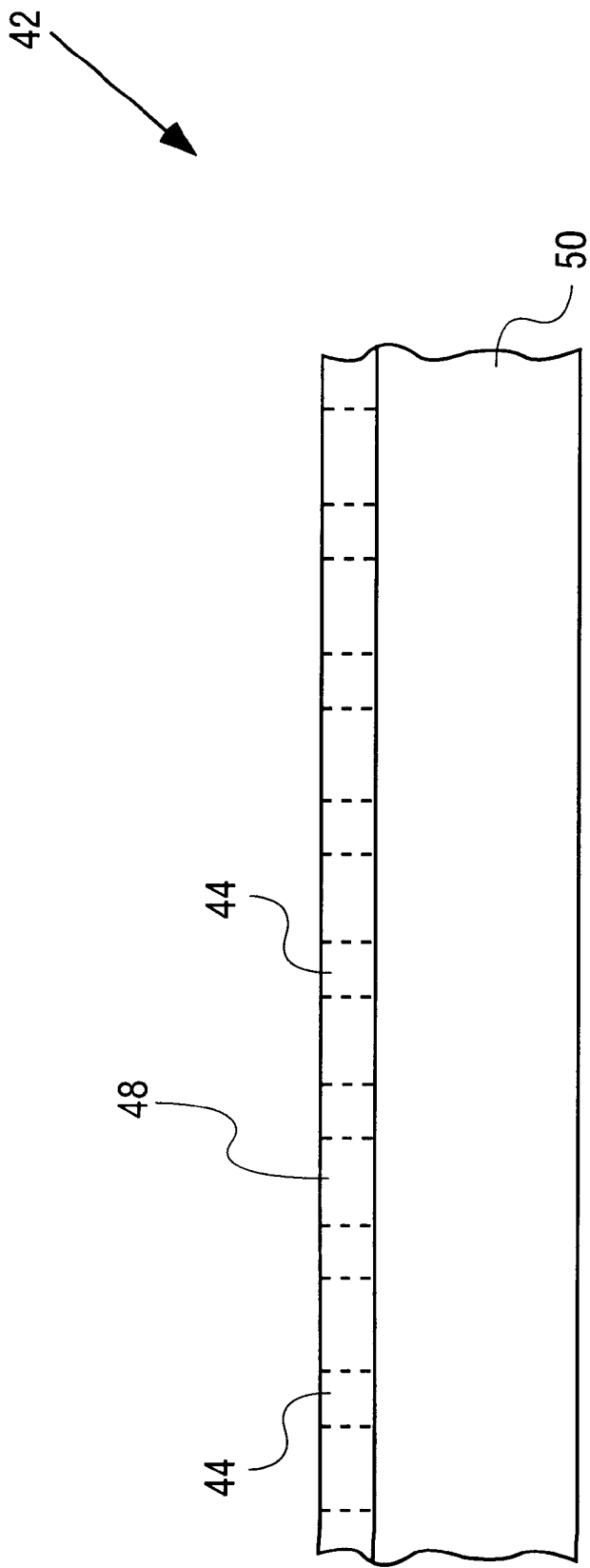
FIG. 4 is a cut-away view of the wafer positioning system shown in FIG. 3A in accordance with the teachings of the present invention.

FIGS. 3A, 3B and 4 show different views of a wafer positioning system in accordance with the teachings of the present invention. Wafer holding stage 40 rides on a thin layer of air on the surface of a base stage 42 with the aid of an air bearing (not shown). Wafer holding stage 40 may be a conventional wafer holding stage such as stage 10 described above. The surface of base stage 42 has a continuous magnetizable region 46. Isolated square cavities 44 are formed in a uniform pattern within continuous magnetizable region 46. Cavities 44 are nonmagnetizable regions which are typically filled with epoxy to make the surface of base stage 42 substantially flat. In one embodiment, each cavity 44 is spaced apart from an adjacent cavity 44 in either direction, X or Y, by equal distances. It is appreciated that the orientation of cavities 44 is not limited to any one set of axes.

In one embodiment, cavities 44 are etched in a continuous sheet 48 of a magnetically soft material such as a transformer steel, thereby forming a continuous magnetizable region. After cavities 44 are etched, sheet 48 is affixed to a foundation 50, which is preferably also made of a magnetically soft material. Because sheet 48 has a fixed thickness, it is always possible to ensure that cavities 44 have equal depths by etching all the way through sheet 48. In another embodiment, cavities are etched directly into the surface of a base stage or foundation rather than a thin sheet. The ease of etching small, isolated cavities rather than narrow, intersecting grooves allows for the creation of a uniform pattern of cavities, which, in turn, provides a uniformly continuous magnetizable region that can accommodate greater flux. Furthermore, because cavity dimensions can be controlled more easily, the magnetizable areas between cavities will have more equal dimensions, thereby providing for more accurate incremental movements of a wafer holding stage. It should be noted that the present invention can be used with existing wafer holding stages. Also, the continuous magnetizable region may be located on a stage which moves rather than a stationary stage.

Figure 5:
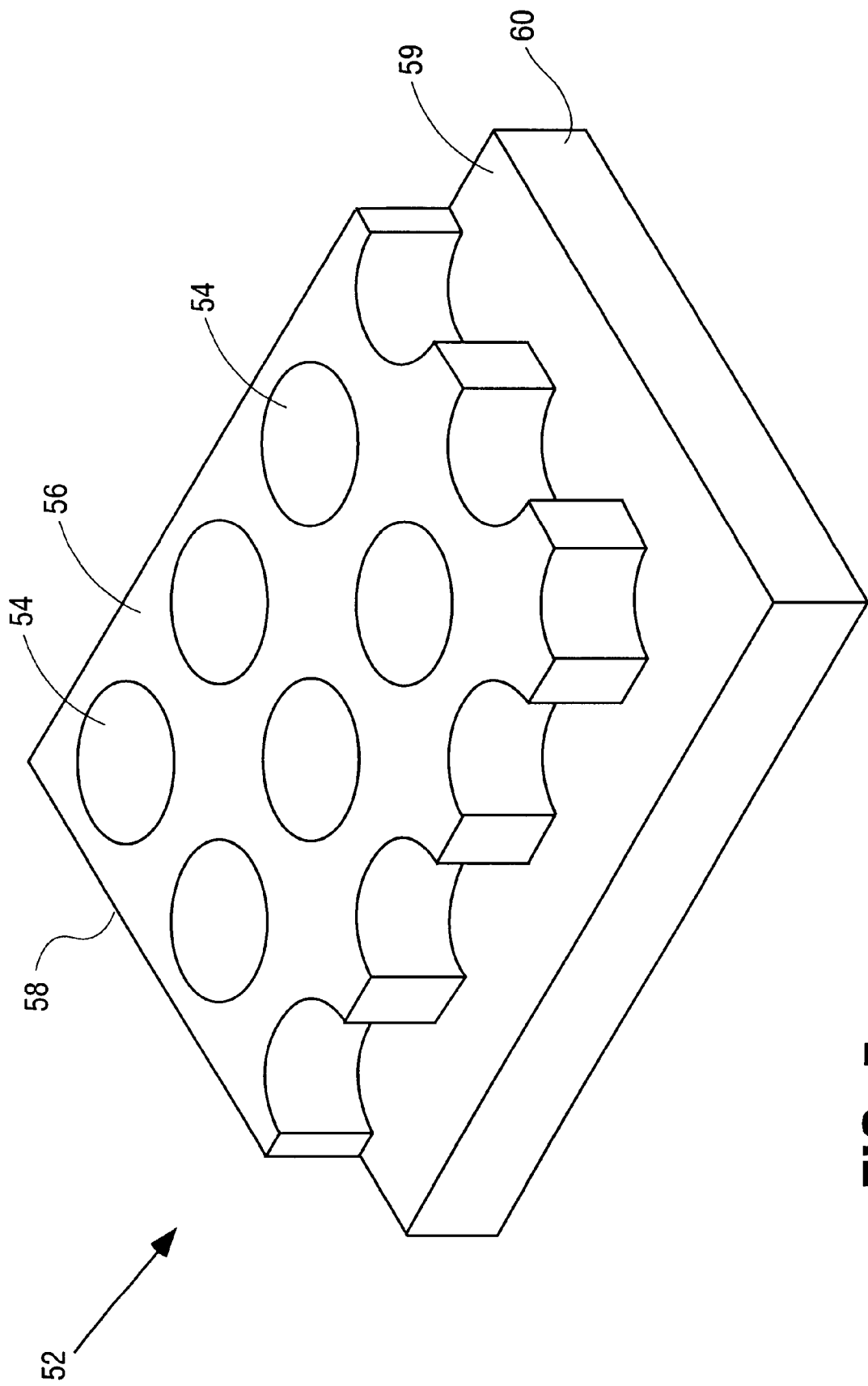
FIG. 5 is a perspective view of another embodiment of a base stage in accordance with the teachings of the present invention.

FIG. 5 is a perspective view of another embodiment of a base stage 52 in accordance with the teachings of the present invention. Circular cavities 54 are etched in a sheet 58, which is preferably made of a magnetically soft material, to create a uniform pattern of cavities 54 within a continuous magnetizable region 56. Sheet 58 is affixed to a top surface 59 of a foundation 60, which is also preferably made of a magnetically soft material, to form base stage 52. Cavities 54 are filled with epoxy if an air bearing is used on base stage 52. Although the present invention has been shown with square cavities and circular cavities, it should be noted that the important features of the cavities, regardless of their shape, are the consistency of their size and the uniformity of the pattern in which they are formed, and thus, numerous different cavity shapes may be formed in a continuous magnetizable layer.

Figure 6:
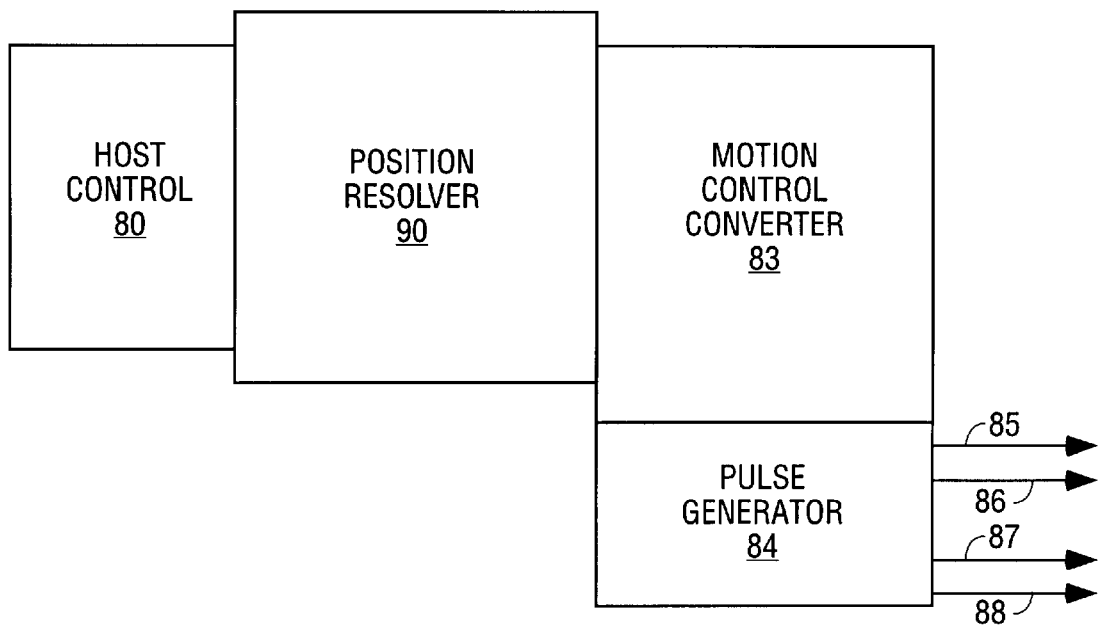
FIG. 6 is a block diagram of a motion control system used to control a wafer positioning system in accordance with the teachings of the present invention.

FIG. 6 shows an example of a motion control system that can be used to control a wafer positioning system in accordance with the teachings of the present invention. A host control 80 sends the coordinates of a desired position of a wafer to a position resolver 90. Position resolver 90 stores the coordinates of the current position and compensates for movement in different axes by performing an algorithm that accounts for factors such as temperature and scaling. Furthermore, position resolver 90 determines the distances necessary to move from the current position to the desired position. The distances are sent to a motion control converter 83 which converts the distances into a corresponding number of digital signal pulses. A pulse generator 84 then generates the required number of digital signal pulses and sends the pulses along outputs 85–88 to digital-to-analog resolvers (not shown), which activate the motors of a wafer holding stage. In one embodiment, outputs 85 and 86 are associated with movement in one axis, and outputs 87 and 88 are associated with movement in a second axis.

Figure 7:
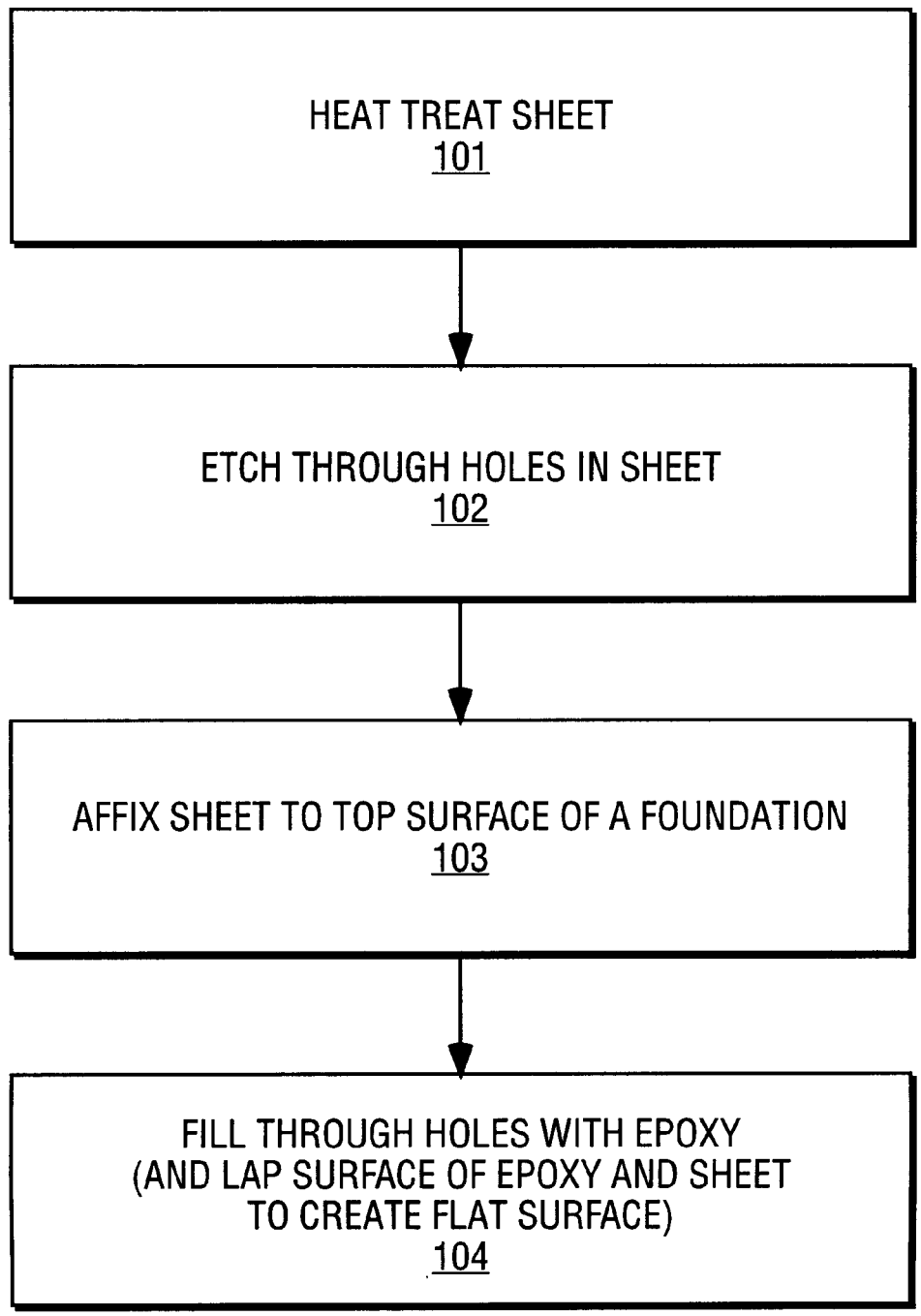
FIG. 7 is a flowchart illustrating various operations of a method in accordance with the teachings of the present invention.

FIG. 7 is a flowchart showing various operations of a method in accordance with the teachings of the present invention. In operation 101, a sheet of a magnetically soft material is heat treated. In operation 102, cavities are etched in a uniform pattern through the sheet. In operation 103, the sheet is affixed to the top surface of a foundation made of a magnetically soft material. Finally, in operation 104, the cavities are filled with epoxy to make the surface of the sheet, including the cavities and the continuous magnetizable region of the sheet, substantially smooth to accommodate the use of an air bearing on the surface of the sheet. It has been assumed that when an air bearing is used to create a substantially frictionless coupling between the sheet and the wafer holding stage, the air outlets for the air bearing are on the wafer holding stage. However, in an alternative embodiment, these outlets may be placed on the sheet formed by the method shown in FIG. 7 by leaving certain cavities open (unfilled with epoxy).

In the foregoing detailed description, the apparatus and method of the present invention have been described with reference to specific exemplary embodiments. In particular, although specific reference has been made to wafer positioning systems, it is appreciated that the present invention is applicable to other positioning systems. Furthermore, it will be evident that various modifications and changes may be made without departing from the broader scope and spirit of the present invention. The present specification and figures are accordingly to be regarded as illustrative rather than restrictive.

What is claimed is:

1. A positioning system comprising:
    a motor system having a first stage adjacent to a second stage, said first stage having a surface with a plurality of magnetizable regions and a first plurality of nonmagnetizable regions, said second stage comprising a substrate having a continuous surface with a continuous magnetizable region and a second plurality of nonmagnetizable regions; and a movement control system coupled to said motor system for moving said first and second stages relative to each other.

2. The positioning system of claim 1 wherein said plurality of magnetizable regions is uniformly patterned on said surface of said first stage.

3. The positioning system of claim 1 wherein said second plurality of nonmagnetizable regions is uniformly patterned in said continuous surface.

4. The positioning system of claim 1 wherein said continuous surface is a surface of a layer applied to said substrate.

5. The positioning system of claim 3 wherein each nonmagnetizable region of said second plurality of nonmagnetizable regions is spaced apart from an adjacent nonmagnetizable region by a first distance measured along a first direction and wherein each nonmagnetizable region of said second plurality of nonmagnetizable regions is spaced apart from an adjacent nonmagnetizable region by a second distance measured along a second direction.

6. The positioning system of claim 5 wherein said first and second distances are substantially equal.

7. The positioning system of claim 1 wherein said first plurality of nonmagnetizable regions comprises grooves.

8. The positioning system of claim 1 wherein said second plurality of nonmagnetizable regions comprises cavities and wherein said substrate comprises a substantially flat planar surface.

9. The positioning system of claim 1 wherein said first stage comprises a wafer holding stage.

10. A positioning apparatus comprising:

a motor system having a stage adjacent to a base, a first surface of said stage having a plurality of magnetizable regions and a first plurality of nonmagnetizable regions, a second surface of said base having a continuous magnetizable region and a second plurality of nonmagnetizable regions, said first and second surfaces facing each other; and a movement control system coupled to said motor system for moving said stage relative to said base.

11. The positioning apparatus of claim 10 wherein each nonmagnetizable region of said second plurality of nonmagnetizable regions has a first shape.

12. The positioning apparatus of claim 10 wherein said base comprises a magnetically soft material.

13. The positioning apparatus of claim 10 wherein said stage and said base are magnetically attractable to each other.

14. The positioning apparatus of claim 10 wherein said first and second pluralities of nonmagnetizable regions comprise an epoxy material.

15. A method of making a stage in a positioning apparatus, said method comprising:

etching a plurality of through holes in a sheet; and affixing said sheet to a top surface of a stage foundation.

16. The method of claim 15 further comprising heat treating said sheet before said etching is performed.

17. The method of claim 15 further comprising filling said through holes with epoxy such that a top surface of said sheet is substantially smooth, said filling being performed after said affixing.

18. The method of claim 15 wherein said etching is performed at repeating intervals such that said through holes form a uniform pattern in said sheet.

19. The method of claim 15 wherein said material sheet and said foundation comprise a magnetically soft material.

20. A positioning apparatus comprising:

a base having a first surface with a first plurality of nonmagnetizable regions located within a continuous region of magnetically soft material; and a wafer holding stage disposed above said base, said wafer holding stage having a second surface with a second plurality of nonmagnetizable regions forming a uniform pattern with a plurality of magnetizable regions, said second surface facing said first surface.

21. The positioning apparatus of claim 20 wherein said first plurality of nonmagnetizable regions form a uniform pattern on said first surface.

22. A positioning apparatus comprising:

a stage for a linear motor, said stage comprising a substrate having a continuous planar surface with a continuous magnetizable region and a plurality of nonmagnetizble regions.

23. The positioning apparatus of claim 22 further comprising:

a further stage for said linear motor, said further stage coupled to said stage by an air bearing;

a movement control system coupled to said stage and to said further stage and configured to control movement of said further stage and said stage relative to each other.

24. The positioning apparatus of claim 23 wherein said linear motor is a Sawyer motor.

* * * * *